United States Patent
Martin et al.

(10) Patent No.: US 11,494,127 B2
(45) Date of Patent: Nov. 8, 2022

(54) CONTROLLING COMPRESSION OF INPUT/OUTPUT (I/O) OPERATIONS)

(71) Applicant: EMC IP Holding Company LLC, Hopkinton, MA (US)

(72) Inventors: Owen Martin, Hopedale, MA (US); Malak Alshawabkeh, Franklin, MA (US)

(73) Assignee: EMC IP Holding Company LLC, Hopkinton, MA (US)

(*) Notice: Subject to any disclaimer, the term of this patent is extended or adjusted under 35 U.S.C. 154(b) by 0 days.

(21) Appl. No.: 16/517,933

(22) Filed: Jul. 22, 2019

(65) Prior Publication Data

US 2021/0026571 A1 Jan. 28, 2021

(51) Int. Cl.
- *G06F 3/06* (2006.01)
- *H03M 7/30* (2006.01)

(52) U.S. Cl.
CPC .......... *G06F 3/0661* (2013.01); *G06F 3/0608* (2013.01); *G06F 3/0653* (2013.01); *G06F 3/0673* (2013.01); *H03M 7/6011* (2013.01)

(58) Field of Classification Search
None
See application file for complete search history.

(56) References Cited

U.S. PATENT DOCUMENTS

| | | | |
|---|---|---|---|
| 5,490,260 A * | 2/1996 | Miller | G06F 3/0601 711/100 |
| 9,385,749 B1* | 7/2016 | Nam | H03M 7/6094 |
| 9,733,836 B1* | 8/2017 | Garg | G06F 3/0631 |
| 10,097,202 B1* | 10/2018 | Ki | G11B 20/00007 |
| 2007/0226444 A1* | 9/2007 | Yagawa | G06F 3/0638 711/170 |
| 2011/0225131 A1* | 9/2011 | Isobe | G06F 16/10 707/693 |
| 2013/0275396 A1* | 10/2013 | Condict | H03M 7/607 707/693 |
| 2016/0309363 A1* | 10/2016 | Persson | H04L 69/22 |
| 2016/0350021 A1* | 12/2016 | Matsushita | G06F 12/04 |
| 2020/0393968 A1* | 12/2020 | Kawase | H03M 7/30 |

* cited by examiner

*Primary Examiner* — Edward J Dudek, Jr.
*Assistant Examiner* — Ralph A Verderamo, III
(74) *Attorney, Agent, or Firm* — Krishnendu Gupta; Nikhil Patel

(57) ABSTRACT

Embodiments of the present disclosure measure a state of a storage group within a storage array. The embodiments also increase or decrease a compression ratio corresponding to input/output (I/O) operations on the storage group based on a target data reduction ratio (DRR) of the storage array, an expected performance envelope, and a compressibility factor of the storage group.

16 Claims, 5 Drawing Sheets

CONTROLLING COMPRESSION OF INPUT/OUTPUT (I/O) OPERATIONS)

BACKGROUND

Data compression is a reduction in the number of bits needed to represent data. Compressing data can save storage capacity, speed up file transfer, and decrease costs for storage hardware and network bandwidth. Compression is performed by a program that uses a formula or algorithm to determine how to shrink the size of the data. For instance, an algorithm may represent a string of bits—or 0 s and 1 s—with a smaller string of 0 s and 1 s by using a dictionary for the conversion between them, or the formula may insert a reference or pointer to a string of 0 s and 1 s that the program has already seen. Data compression can dramatically decrease the amount of storage a file takes up. For example, in a 2:1 compression ratio, a 20-megabyte (MB) file takes up 10 MB of space. Because of compression, administrators spend less money and less time on storage.

SUMMARY

One or more aspects of the present disclosure relates to measuring a state of a storage group within a storage array. A compression ratio corresponding to input/output (I/O) operations on the storage group is increased or decreased based on a target data reduction ratio (DRR) of the storage array, an expected performance envelope, and a compressibility factor of the storage group.

In embodiments, the state of the storage group can be measured periodically, wherein the storage group is one of a plurality of storage groups and a state of each storage group is measured periodically.

In embodiments, the state of the storage group can be measured by measuring the state of the storage group per I/O operations of an application.

In embodiments, the state can be measured by: monitoring a number of compressed I/O operations vs uncompressed I/O operations for the storage group; and comparing the number with the target DRR to ensure a compression bandwidth is fully utilized In embodiments, I/O operations on the storage group can be determined to be either within or below the expected performance envelope.

In embodiments, the aspects can also include determining if the target data DRR of the storage array is met if the I/O operations on the storage group is below the expected performance envelope.

In embodiments, a service level of the I/O operations of an application comprising can be adjusted based on whether the I/O operations are within the expected performance envelope.

In embodiments, adjusting the service level of the I/O operations of the application can further be based on whether the target DRR of the storage array is met.

BRIEF DESCRIPTION OF THE DRAWINGS

The foregoing and other objects, features and advantages will be apparent from the following more particular description of the embodiments, as illustrated in the accompanying drawings in which like reference characters refer to the same parts throughout the different views. The drawings are not necessarily to scale, emphasis instead being placed upon illustrating the principles of the embodiments.

DETAILED DESCRIPTION

Figure 1:
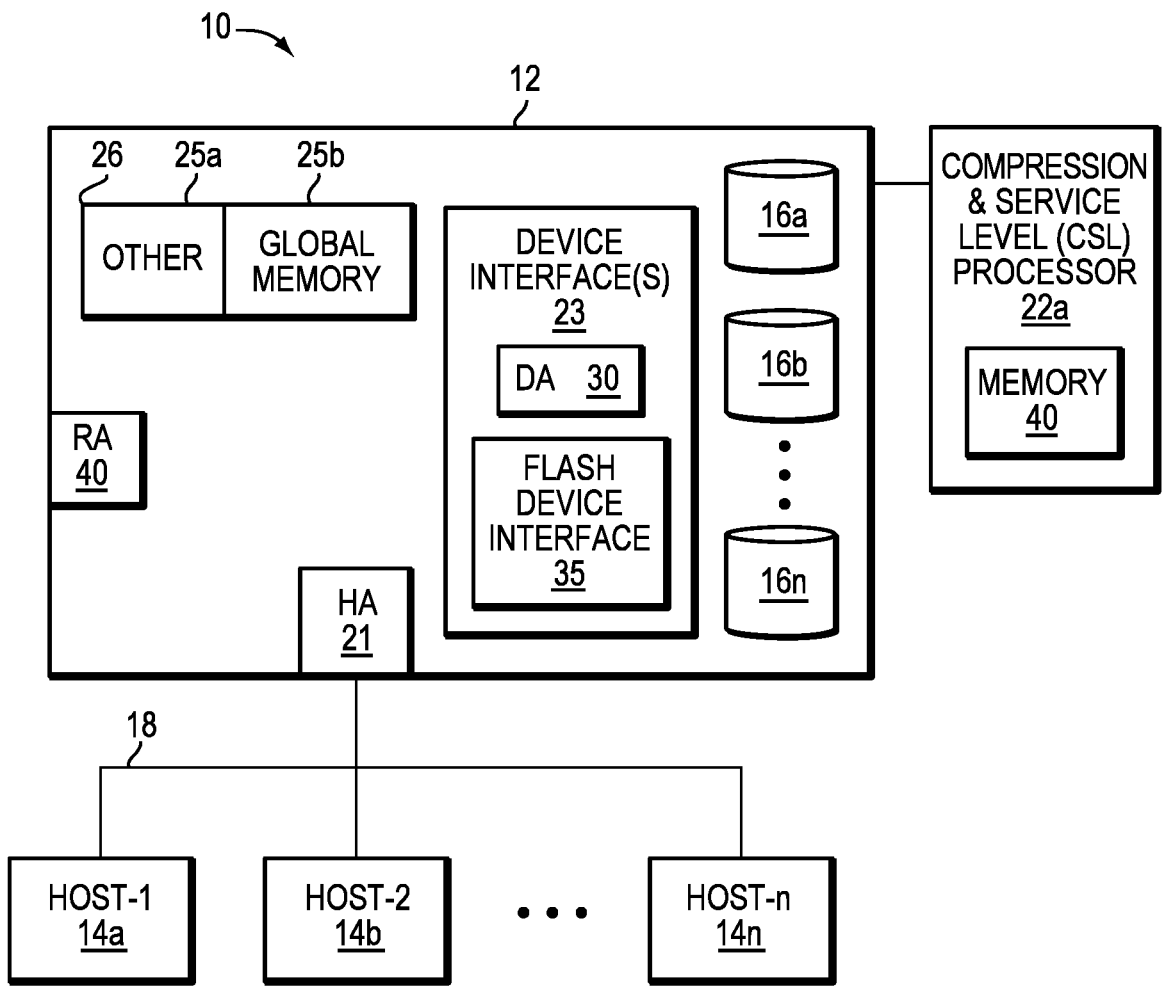
FIG. 1 is a block diagram of an example a storage system in accordance with example embodiments disclosed herein.

Described below is a set of techniques for managing data compression in storage systems. The techniques may be used to provide, among other things, measuring a state of a storage group within a storage array, and at least one of increasing or decreasing a compression ratio corresponding to input/output (I/O) operations on the storage group based on a target data reduction ratio (DRR) of the storage array, an expected performance envelope, and a compressibility factor of the storage group.

Data compression is an efficiency feature that allows users to store compressed data using less storage capacity than uncompressed data. With data compression, users can significantly increase storage utilization for data such as file data and block data. Data compression may be characterized as the process of encoding source information using an encoding scheme into a compressed form having fewer bits than the original or source information. Different encoding schemes may be used in connection with data compression and have different data reduction ratios (DRR), also referred herein as "data compression ratio".

A data compression ratio for data is defined as the ratio between the uncompressed size and compressed size of the data. For example, a compression ratio of 2 to 1 (or also referred to herein as 50%) indicates that the compressed size of compressed data is about one half the original size of uncompressed data, while a compression ratio of 10 to 1 (also referred to herein as 10%) indicates that the compressed size of compressed data is about a tenth of the original size of original data. Further, storage space savings achieved by compressing data may be defined as the reduction in the compressed size of compressed data relative to the uncompressed size. For example, if a set of uncompressed file system data is 10 Mega Bytes (MB) in size and is compressed to 2 MB, a compression ratio is computed is 5:1 (or 20%), and the space savings=1−compressed/uncompressed=1−(2/10)=0.8; which is usually represented in a percentage so here it would be 80%.

Current compression techniques can establish a predefined compression setting in which 80% of allocations in the storage array are compressed, thereby allowing 20% of the busiest allocations to skip compression to benefit the system of address space that is allocated for compressed data. Such techniques control compression to meet a predefined capacity constraint which may not ensure the target DRR. For example, those techniques may not use data compressibility to optimize for system DRR or storage service level. Without such optimization, customers can experience unpredictable DRR behavior. Additionally, without such optimization, a customer cannot be aware of how much their data set storage footprint can be reduced and the impact it might have on performance.

Embodiments of the present disclosure measure a state of a storage group (SG) within a storage array and increase or decrease a compression ratio corresponding to input/output (I/O) operations on the storage group based on a target data reduction ratio (DRR) of the storage array, an expected performance envelope, and a compressibility factor of the storage group.

Referring to FIG. 1, shown is an example of an embodiment of a system 10 that may be used in connection with performing the techniques described herein. The system 10 includes a data storage system 12 connected to host systems 14a-14n through communication medium 18. In embodiments, the hosts 14a-14n can access the data storage system 12, for example, to perform input/output (I/O) operations or data requests. The communication medium 18 can be any one or more of a variety of networks or other type of communication connections as known to those skilled in the art. The communication medium 18 may be a network connection, bus, and/or other type of data link, such as a hardwire or other connections known in the art. For example, the communication medium 18 may be the Internet, an intranet, network (including a Storage Area Network (SAN)) or other wireless or other hardwired connection(s) by which the host 14a-14n can access and communicate with the data storage system 12. The hosts 14a-14n can also communicate with other components included in the system 10 via the communication medium 18.

Each of the hosts 14a-14n and the data storage system 12 can be connected to the communication medium 18 by any one of a variety of connections as may be provided and supported in accordance with the type of communication medium 18. The processors included in the hosts 14a-14n may be any one of a variety of proprietary or commercially available single or multi-processor system, such as an Intel-based processor, or other type of commercially available processor able to support traffic in accordance with each embodiment and application.

It should be noted that the examples of the hardware and software that may be included in the data storage system 12 are described herein in more detail and can vary with each embodiment. Each of the hosts 14a-14n and data storage system 12 can all be located at the same physical site or can be located in different physical locations. Examples of the communication medium 18 that can be used to provide the different types of connections between the host computer systems and the data storage system of the system 10 can use a variety of different communication protocols such as SCSI, Fibre Channel, iSCSI, and the like. Some or all the connections by which the hosts 14a-14n and data storage system 12 can be connected to the communication medium may pass through other communication devices, such switching equipment that may exist such as a phone line, a repeater, a multiplexer or even a satellite.

Each of the hosts 14a-14n can perform different types of data operations in accordance with different types of tasks. In embodiments, any one of the hosts 14a-14n may issue a data request to the data storage system 12 to perform a data operation. For example, an application executing on one of the hosts 14a-14n can perform a read or write operation resulting in one or more data requests to the data storage system 12.

It should be noted that although element 12 is illustrated as a single data storage system, such as a single data storage array, element 12 may also represent, for example, multiple data storage arrays alone, or in combination with, other data storage devices, systems, appliances, and/or components having suitable connectivity, such as in a SAN, in an embodiment using the techniques herein. It should also be noted that an embodiment may include data storage arrays or other components from one or more vendors. In subsequent examples illustrated the techniques herein, reference may be made to a single data storage array by a vendor, such as by DELL Technologies of Hopkinton, Massachusetts. However, as will be appreciated by those skilled in the art, the techniques herein are applicable for use with other data storage arrays by other vendors and with other components than as described herein for purposes of example.

The data storage system 12 may be a data storage array including a plurality of data storage devices 16a-16n. The data storage devices 16a-16n may include one or more types of data storage devices such as, for example, one or more disk drives and/or one or more solid state drives (SSDs). An SSD is a data storage device that uses solid-state memory to store persistent data. An SSD using SRAM or DRAM, rather than flash memory, may also be referred to as a RAM drive. SSD may refer to solid state electronics devices as distinguished from electromechanical devices, such as hard drives, having moving parts. Flash devices or flash memory-based SSDs are one type of SSD that contains no moving parts. The techniques described herein can be used in an embodiment in which one or more of the devices 16a-16n are flash drives or devices. More generally, the techniques herein may also be used with any type of SSD although following paragraphs can refer to a particular type such as a flash device or flash memory device.

The data storage array 12 may also include different types of adapters or directors, such as an HA 21 (host adapter), RA 40 (remote adapter), and/or device interface 23. Each of the adapters HA 21, RA 40 may be implemented using hardware including a processor with local memory with code stored thereon for execution in connection with performing different operations. The HA 21 may be used to manage communications and data operations between one or more host systems 14a-14n and the global memory (GM) 25b. In an embodiment, the HA 21 may be a Fibre Channel Adapter (FA) or another adapter which facilitates host communication. The HA 21 may be characterized as a front-end component of the data storage system 12 which receives a request from one or more of the hosts 14a-14n. The data storage array 12 can include one or more RAs (e.g., RA 40) that may be used, for example, to facilitate communications between data storage arrays. The data storage array 12 may also include one or more device interfaces 23 for facilitating data transfers to/from the data storage devices 16a-16n. The data storage interfaces 23 may include device interface modules, for example, one or more disk adapters (DAs) 30 (e.g., disk controllers), flash drive interface 35, and the like. The DA 30 can be characterized as a back-end component of the data storage system 12 which interfaces with the physical data storage devices 16a-n.

One or more internal logical communication paths may exist between the device interfaces 23, the RAs 40, the HAs 21, and the memory 26. An embodiment, for example, may use one or more internal busses and/or communication modules. For example, the global memory 25b may be used to facilitate data transfers and other communications between the device interfaces, HAs and/or RAs in a data storage array. In one embodiment, the device interfaces 23 may perform data operations using a cache that may be included in the global memory 25b, for example, when communicating with other device interfaces and other components of the data storage array. The other portion 25a is that portion of memory that may be used in connection with other designations that may vary in accordance with each embodiment.

The data storage system as described in this embodiment, or a device thereof, such as a disk or aspects of a flash device, should not be construed as a limitation. Other types of commercially available data storage systems, as well as processors and hardware controlling access to these devices, may also be included in an embodiment.

Host systems 14a-14n provide data and access control information through channels to the storage systems 12, and the storage systems 12 may also provide data to the host systems 14a-14n also through the channels. The host systems 14a-14n do not address the drives or devices 16a-16n of the storage systems directly, but rather access to data can be provided to one or more host systems 14a-n from what the host systems view as a plurality of logical devices or logical volumes (LVs) via, e.g., the HA 21. The LVs may or may not correspond to the actual physical devices or drives 16a-16n. For example, one or more LVs may reside on a single physical drive or multiple drives. Data in a single data storage system, such as a single data storage array 12, may be accessed by multiple hosts allowing the hosts to share the data residing therein. The HA 21 may be used in connection with communications between a data storage array 12 and one or more of the host systems 14a-n. The RA 40 may be used in facilitating communications between two data storage arrays. The DA 30 may be one type of device interface used in connection with facilitating data transfers to/from the associated disk drive(s) 16a-n and LV(s) residing thereon. A flash device interface 35 may be another type of device interface used in connection with facilitating data transfers to/from the associated flash devices and LV(s) residing thereon. It should be noted that an embodiment may use the same or a different device interface for one or more different types of devices than as described herein.

The device interface, such as a DA 30, performs I/O operations on a drive 16a-16n. In the following description, data residing on an LV may be accessed by the device interface following a data request in connection with I/O operations that other directors originate. Data may be accessed by LV in which a single device interface manages data requests in connection with the different one or more LVs that may reside on a drive 16a-16n. For example, a device interface may be a DA 30 that accomplishes the foregoing by creating job records for the different LVs associated with a device. These different job records may be associated with the different LVs in a data structure stored and managed by each device interface.

A compression and service level (CSL) processor 22a may be used monitor I/O operations to compress data and a meet a target data reduction ratio (DRR) of the storage system 12. The CSL processor 22a can be configured to perform one or more compression techniques to maintain the target DRR on storage devices 16a-n as discussed in greater detail herein.

It should be noted that the CSL processor 22a may exist external to the data storage system 12 and may communicate with the data storage system 12 using any one of a variety of communication connections. In other embodiments, the CSL processor 22a may exist internal to the data storage system 12 and consume shared resources of the system 12, e.g., share processing resources of the system 12. In one embodiment, the CSL processor 22a may communicate with the data storage system 12 through three different connections, a serial port, a parallel port and using a network interface card, for example, with an Ethernet connection. Using the Ethernet connection, for example, the CSL processor 22a may communicate directly with DA 30 and HA 21 within the data storage system 12.

Figure 2:
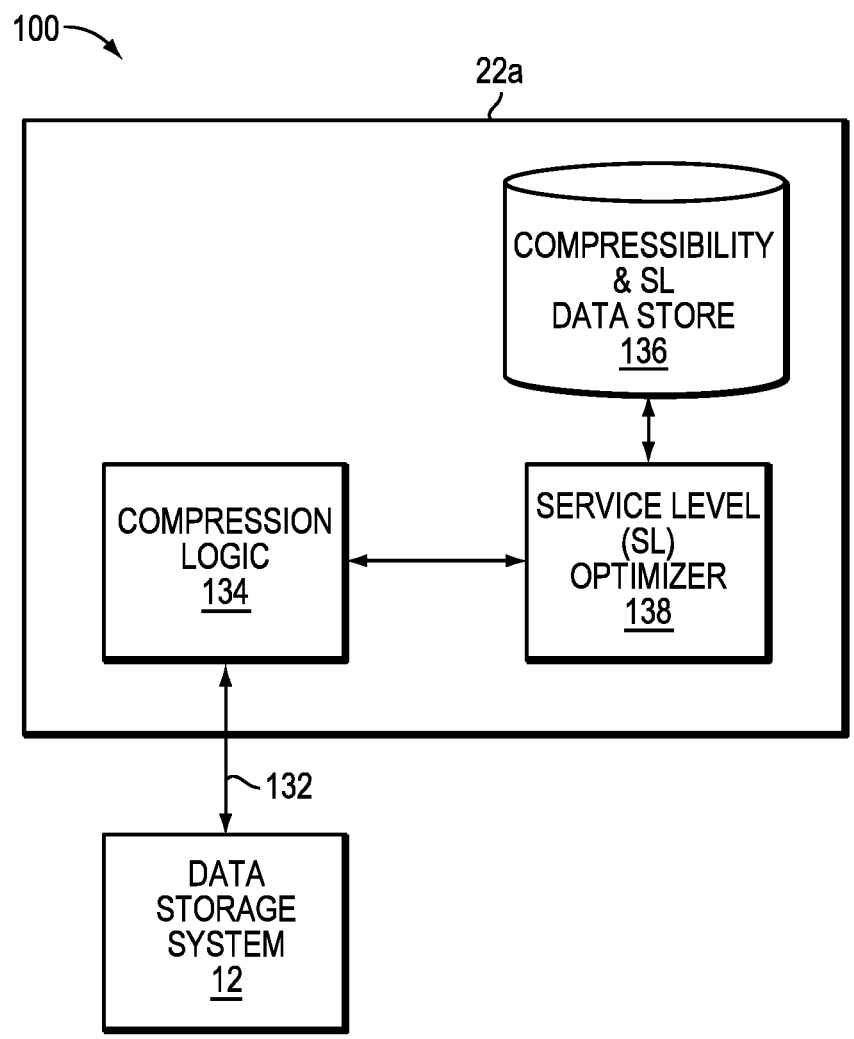
FIG. 2 is a block diagram of an example Compression & Service Level (CSL) processor in accordance with example embodiments disclosed herein.

Referring to FIG. 2, a compression and service level (CSL) processor 22a can include elements 100 (e.g., software and hardware elements). It should be noted that the CSL processor 22a may be any one of a variety of commercially available processors, such as an Intel-based processor, and the like. Although what is described herein shows details of components including software that may reside in the CSL processor 22a, all or portions of the illustrated components may also reside elsewhere such as, for example, on HA 21 or any of the host systems 14a-14n of FIG. 1. In other embodiments, the CSL processor 22a can be a parallel processor such as a graphical processing unit (GPU).

Included in the CSL processor 22a is compression logic 134 which monitors one or more processing threads (e.g., input/output (I/O) operations such as read/write operations) of the data storage system 12 through the connection 132. The compression logic 134 is configured to compress data associated with the I/O operations based on one or more of: a target DRR of the data storage system 12, service level of the data, compressibility of the data, expected performance goals, amongst other factors.

In embodiments, the system 12 can have a target DRR established to ensure that a host's (e.g., any of the host systems 14a-14n of FIG. 1) storage capacity requirements are met. For example, a data storage provider can provide/sell a host a data storage system such as system 12 of FIG. 1 that has 1 terabyte (TB) of physical storage but can offer 3 TB of data storage using one or more compression techniques. Accordingly, such a system has a 3:1 target DRR. The compression logic 134 can be configured to apply one or more compression techniques on data associated with I/O operations with the system 12 to meet the target DRR. The one or more compression techniques can be any known or yet to be known compression technique.

Additionally, the host can use several applications that require data to be stored on the system 12. In embodiments, each application can have a distinct service level (SL) assignment that defines a quality of service (QoS) (e.g., expected performance envelope) expected by a host. In other words, the system 12 is configured to dedicate greater resources (e.g., hardware and/or software) for handling data included in I/O operations associated with applications having a high SL compared to those applications having low SLs. In embodiments, the performance envelope can be defined as a range of input/output operations per second (IOPS). The ranges of performance envelopes can be broken into SL assignment groups such as Bronze, Silver, and GOLD, with Bronze having the lowest range of IOPS and GOLD having the highest range of IOPS.

For each I/O operation, the compression logic 134 can determine the application associated with I/O operation. For example, each I/O operation can take the form of a data packet that includes, e.g., a request and an application identifier (ID) amongst other information. The compression logic 134 can perform a look-up in a SL assignment data structure stored in a compressibility & SL (C&SL) data store 136. The assignment data structure can be stored in the form of a searchable table that maps each application IDs to an SL assignment. In other embodiments, the SL assignment can be included in the data packet corresponding to the I/O operation.

The compression logic 134 can further determine a compressibility factor associated with data included in the I/O operations. For example, the compression logic 134 can perform a look-up in a compressibility data structure stored in the C&SL data store 136. The compressibility data structure can be stored in the form of a searchable table that maps each application IDs to a compressibility factor for each compression technique the compression logic 134 is configured to perform. The compressibility factor can be a metric that is a ratio of original data size to expected compressed data size. In embodiments, the compressibility data structure may not include an entry for each application. Accordingly, the compression logic 134 can be configured to perform a compressibility training to determine a compressibility factor associated with an application. For example, the compression logic 134 can apply a default compression technique on the data and determine the compressibility factor and update the compressibility data structure.

Based on the compressibility of data associated with an I/O request of an application, the compression logic 134 determines an application data (app-data) compression target. For example, a high DRR can be applied to some data without affecting I/O performance (i.e., IOPS), while some I/O performance associated with some app-data can be significantly impaired after a threshold DRR.

Figure 2A:
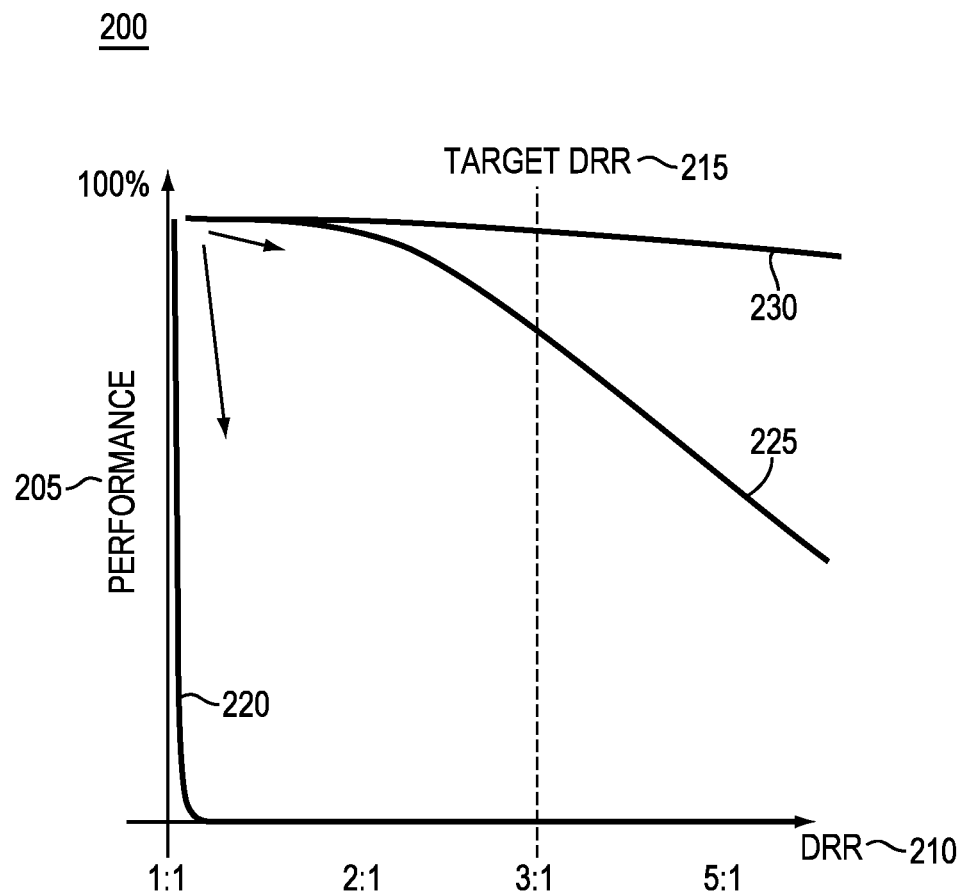
FIG. 2A is a graph that plots performance vs data reduction ratio (DRR) of several example applications in accordance with example embodiments disclosed herein.

For example, referring to FIG. 2A, a graph 200 plots performance 205 with respect to DRR 210 for three applications 220, 225, 230. As stated herein, the data storage system 12 can have an overall target DRR 215 to ensure that the system 12 is able to provide a certain amount of storage capacity. In embodiments, data associated with some applications can have a greater compression ratio as compared to data associated with others so long as the system 12, as a whole, achieves the target DRR 215. Data associated with a first application 220 may not have a high compressibility factor thus, the compression logic 134 may not apply a compression technique on the data to save computing resources to compress other types of data. For example, data associated with a second application 225 may see a significant drop in performance should the compression logic 134 apply a compression technique having greater than a 2:1 compression ratio. Additionally, data associated with a third application 230 may not be affected by high compression ratios thus, the compression logic 134 can apply high compression ratios (e.g., 5:1 or greater) to such data.

In embodiments, a service level (SL) optimizer 138 can be in communication with the compression logic 134 and monitor the one or more processing threads (e.g., input/output (I/O) operations such as read/write operations) of the data storage system 12 through the connection 132. The SL optimizer 138 can be configured to adjust SL assignments of certain applications to maximize performance (i.e., increase a ratio of uncompressed to compressed IOPS over time). For example, the SL optimizer 138 can monitor I/O paths in real-time adjust SL assignments to maximize uncompressed I/O operations while ensuring that system 12 maintains the target DRR (e.g., target DRR 215 of FIG. 2A). The SL optimizer 138 can determine the system's current performance and DRR within any given period. Based on a difference between the system's current and target performance and DRR, the SL optimizer 138 can adjust SL assignments to achieve the target performance and DRR goals.

Figure 3:
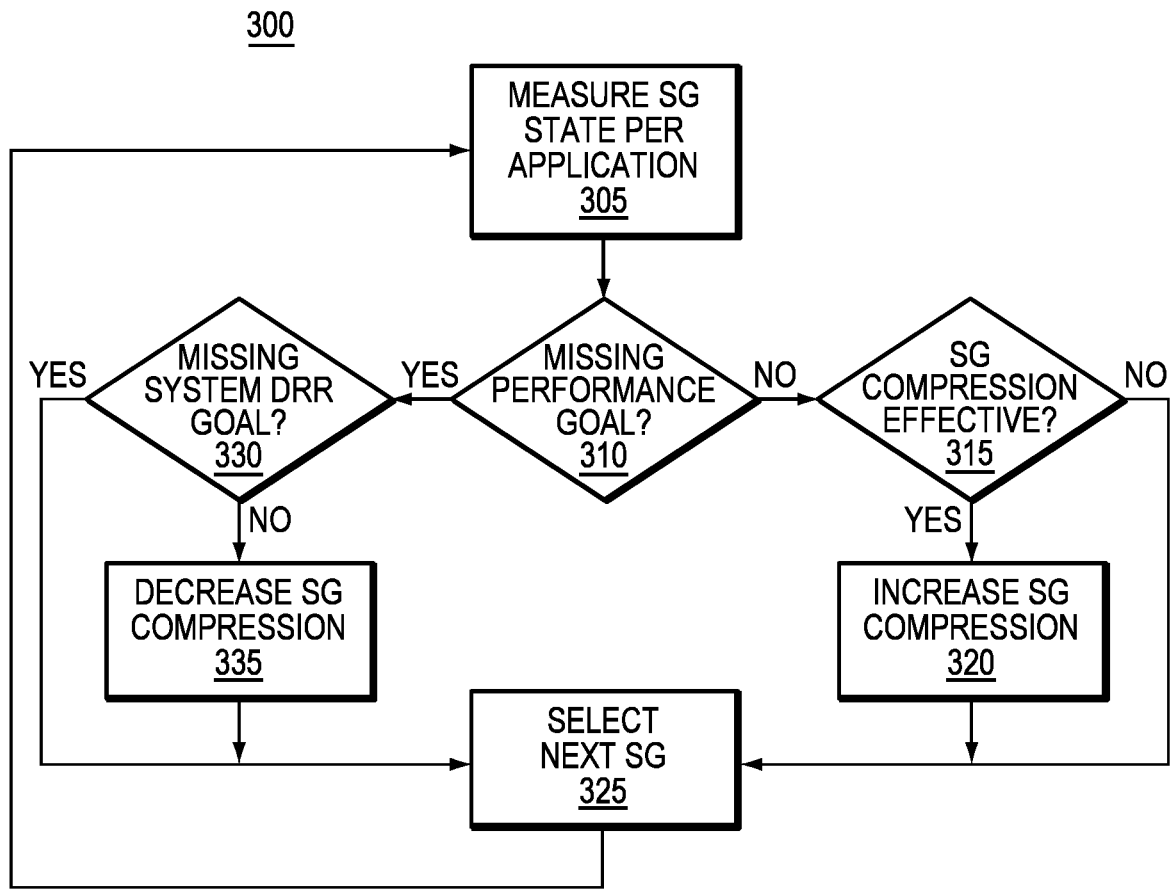
FIG. 3 is a flow diagram of an example method for increasing or decreasing a compression ratio of a storage group (SG) in accordance with example embodiments disclosed herein.
Figure 4:
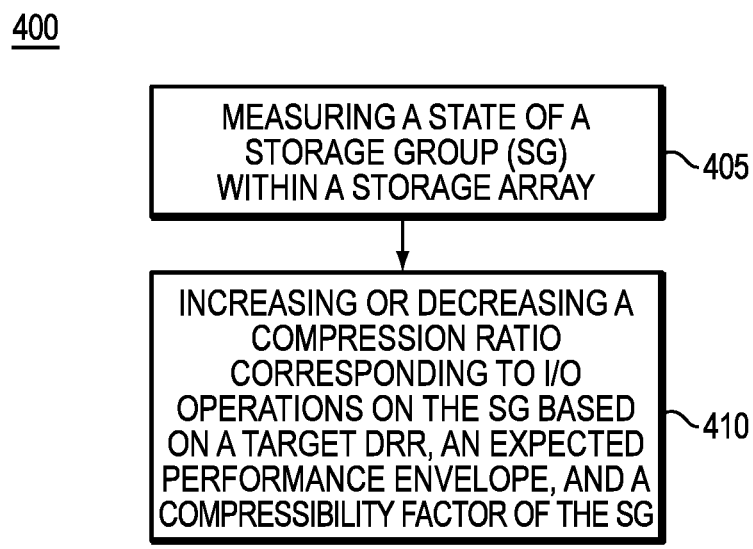
FIG. 4 is a flow diagram of an example method for increasing or decreasing a compression ratio of a storage group (SG) in accordance with example embodiments disclosed herein.

FIGS. 3-4 illustrate methods and/or flow diagrams in accordance with this disclosure. For simplicity of explanation, the methods are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter.

Regarding FIG. 3, a method 300 can be executed by a compression and service level (CSL) processor (e.g., the CSL processor 22a of FIGS. 1-2). The method 300, at 305, can include measuring a storage group state on a per application basis. For example, each storage group of a storage system (e.g., system 12 of FIG. 1) may only be accessible by certain applications and/or hosts. In embodiments, measuring the storage group state can include monitoring a number of compressed I/O operations with respect to uncompressed I/O operations for a storage group (in real-time) and comparing the measurement to a storage group target DRR to ensure a compression bandwidth is fully utilized. For example, bandwidth needed to compress a given amount of data can be determined by how much CPU (central processing unit) and memory is available for a compression thread. At 310, the method 300 determines whether a performance goal (e.g., a target performance) is met for the storage group. If the performance goal is met, the method 300, at 330, includes determining if the storage system is missing its DRR goal (e.g., a target DRR). If the DRR goal is being met, the method 300, at 335, can decrease compression of the storage group and, at 325, select a next storage group. Otherwise, the method 300, at 325, selects a next storage group on which to perform the steps of the method 300.

Referring back to step 310, if the performance goal is not met, the method 300, at 315, determines if compression of a storage group is effective. The effectiveness of compression can be based on a compressibility factor of the storage group. Thus, a medium to high compressibility factor can indicate effective compression while a low compressibility factor can indicate ineffective compression. If compression is effective, the method 300, at 320, can increase a compression ratio of the storage group and, at 325, select a next storage group. If compression is not effective, the method 300, at 325, selects a next storage group on which to perform the steps of the method 300.

Regarding FIG. 4, a method 400 can be executed by a compression and service level (CSL) processor (e.g., the CSL processor 22a of FIGS. 1-2). The method 400, at 405, can include measuring a state of a storage group within a storage array. In embodiments, the state of the storage group can be measured periodically. In further embodiments, measuring the state of the storage group can also include measuring the state of the storage group per I/O operations of an application. The method 400, at 410, can also include increasing or decreasing a compression ratio corresponding to input/output (I/O) operations on the storage group based on a target data reduction ratio (DRR) of the storage array, an expected performance envelope, and a compressibility factor of the storage group. For example, the method 400, at 410, can also include determining if the I/O operations on the storage group is within or below the expected performance envelope and can further include determining if the target data DRR of the storage array is met if the I/O operations on the storage group is below the expected performance envelope. In embodiments, the performance envelope can be defined as a range of input/output operations per second (IOPS). The ranges of performance envelopes can be broken into SL assignment groups such as Bronze, Silver, and GOLD, with Bronze having the lowest range of IOPS and GOLD having the highest range of IOPS.

The above-described systems and methods can be implemented in digital electronic circuitry, in computer hardware, firmware, and/or software. The implementation can be as a computer program product. The implementation can, for example, be in a machine-readable storage device, for execution by, or to control the operation of, data processing apparatus. The implementation can, for example, be a programmable processor, a computer, and/or multiple computers.

A computer program can be written in any form of programming language, including compiled and/or interpreted languages, and the computer program can be deployed in any form, including as a stand-alone program or as a subroutine, element, and/or other unit suitable for use in a computing environment. A computer program can be deployed to be executed on one computer or on multiple computers at one site.

Method steps can be performed by one or more programmable processors executing a computer program to perform functions of the concepts described herein by operating on input data and generating output. Method steps can also be performed by and an apparatus can be implemented as special purpose logic circuitry. The circuitry can, for example, be a FPGA (field programmable gate array) and/or an ASIC (application-specific integrated circuit). Subroutines and software agents can refer to portions of the computer program, the processor, the special circuitry, software, and/or hardware that implement that functionality.

Processors suitable for the execution of a computer program include, by way of example, both general and special purpose microprocessors, and any one or more processors of any kind of digital computer. Generally, a processor receives instructions and data from a read-only memory or a random-access memory or both. The essential elements of a computer are a processor for executing instructions and one or more memory devices for storing instructions and data. Generally, a computer can include, can be operatively coupled to receive data from and/or transfer data to one or more mass storage devices for storing data (e.g., magnetic, magneto-optical disks, or optical disks).

Data transmission and instructions can also occur over a communications network. Information carriers suitable for embodying computer program instructions and data include all forms of non-volatile memory, including by way of example semiconductor memory devices. The information carriers can, for example, be EPROM, EEPROM, flash memory devices, magnetic disks, internal hard disks, removable disks, magneto-optical disks, CD-ROM, and/or DVD-ROM disks. The processor and the memory can be supplemented by, and/or incorporated in special purpose logic circuitry.

To provide for interaction with a user, the above described techniques can be implemented on a computer having a display device. The display device can, for example, be a cathode ray tube (CRT) and/or a liquid crystal display (LCD) monitor. The interaction with a user can, for example, be a display of information to the user and a keyboard and a pointing device (e.g., a mouse or a trackball) by which the user can provide input to the computer (e.g., interact with a user interface element). Other kinds of devices can be used to provide for interaction with a user. Other devices can, for example, be feedback provided to the user in any form of sensory feedback (e.g., visual feedback, auditory feedback, or tactile feedback). Input from the user can, for example, be received in any form, including acoustic, speech, and/or tactile input.

The above described techniques can be implemented in a distributed computing system that includes a back-end component. The back-end component can, for example, be a data server, a middleware component, and/or an application server. The above described techniques can be implemented in a distributing computing system that includes a front-end component. The front-end component can, for example, be a client computer having a graphical user interface, a Web browser through which a user can interact with an example implementation, and/or other graphical user interfaces for a transmitting device. The components of the system can be interconnected by any form or medium of digital data communication (e.g., a communication network). Examples of communication networks include a local area network (LAN), a wide area network (WAN), the Internet, wired networks, and/or wireless networks.

The system can include clients and servers. A client and a server are generally remote from each other and typically interact through a communication network. The relationship of client and server arises by computer programs running on the respective computers and having a client-server relationship to each other.

Packet-based networks can include, for example, the Internet, a carrier internet protocol (IP) network (e.g., local area network (LAN), wide area network (WAN), campus area network (CAN), metropolitan area network (MAN), home area network (HAN)), a private IP network, an IP private branch exchange (IPBX), a wireless network (e.g., radio access network (RAN), 802.11 network, 802.16 network, general packet radio service (GPRS) network, HiperLAN), and/or other packet-based networks. Circuit-based networks can include, for example, the public switched telephone network (PSTN), a private branch exchange (PBX), a wireless network (e.g., RAN, Bluetooth, code-division multiple access (CDMA) network, time division multiple access (TDMA) network, global system for mobile communications (GSM) network), and/or other circuit-based networks.

The transmitting device can include, for example, a computer, a computer with a browser device, a telephone, an IP phone, a mobile device (e.g., cellular phone, personal digital assistant (PDA) device, laptop computer, electronic mail device), and/or other communication devices. The browser device includes, for example, a computer (e.g., desktop computer, laptop computer) with a world wide web browser (e.g., Microsoft® Internet Explorer® available from Microsoft Corporation, Mozilla® Firefox available from Mozilla Corporation). The mobile computing device includes, for example, a Blackberry®.

Comprise, include, and/or plural forms of each are open ended and include the listed parts and can include additional parts that are not listed. And/or is open ended and includes one or more of the listed parts and combinations of the listed parts.

One skilled in the art will realize the concepts described herein may be embodied in other specific forms without departing from the spirit or essential characteristics thereof. The foregoing embodiments are therefore to be considered in all respects illustrative rather than limiting of the concepts described herein. Scope of the concepts is thus indicated by the appended claims, rather than by the foregoing description, and all changes that come within the meaning and range of equivalency of the claims are therefore intended to be embraced therein.

What is claimed is:

1. A method comprising:
   measuring a state of a storage group within a storage array;
   at least one of increasing or decreasing compression ratio corresponding to input/output (I/O) operations on the storage group based on a target data reduction ratio (DRR) of the storage array, an expected performance envelope, a service level (SL) corresponding to the I/O operations, and a compressibility factor of the storage group, wherein the service level for each I/O operation corresponds to the SL of a source of the I/O operation and wherein the SL defines a quality of service (QoS) expected by the source;
   wherein increasing or decreasing the compression ratio includes adjusting an SL assignment of an application related to the I/O operation; and
   wherein increasing or decreasing the compression ratio includes:
   determining a compression bandwidth utilization of the storage group's compression thread,
   measuring the storage group's performance based on its range of I/O operations per second (IOPS), and
   increasing or decreasing the compression ratio based on a target DRR of the storage array as a whole, the target DRR of the storage group, and a service level agreement (SLA).

2. The method of claim 1 further comprising measuring the state of the storage group periodically, wherein the storage group is one of a plurality of storage groups and a state of each storage group is measured periodically.

3. The method of claim 1 measuring the state of the storage group includes measuring the state of the storage group per I/O operations of an application.

4. The method of claim 1 wherein measuring the state includes:
   monitoring a number of compressed I/O operations vs uncompressed I/O operations for the storage group; and
   comparing the number with the target DRR to ensure a compression bandwidth is fully utilized.

5. The method of claim 1 further comprising determining if the I/O operations on the storage group is within or below the expected performance envelope.

6. The method of claim 5 further comprising determining if the target data DRR of the storage array is met if the I/O operations on the storage group is below the expected performance envelope.

7. The method of claim 1 further comprising adjusting a service level of the I/O operations of an application based on whether the I/O operations are within the expected performance envelope.

8. The method of claim 7 wherein adjusting the service level of the I/O operations of the application is further based on whether the target DRR of the storage array is met.

9. An apparatus comprising at least one processor configured to:
   measure a state of a storage group within a storage array;
   at least one of increase or decrease a compression ratio corresponding to input/output (I/O) operations on the storage group based on a target data reduction ratio (DRR) of the storage array, an expected performance envelope, a service level (SL) corresponding to the I/O operations, and a compressibility factor of the storage group, wherein the service level for each I/O operation corresponds to the SL of a source of the I/O operation and wherein the SL defines a quality of service (QoS) expected by the source;
   wherein increasing or decreasing the compression ratio includes adjusting an SL assignment of an application related to the I/O operation; and
   wherein increasing or decreasing the compression ratio includes:
   determining a compression bandwidth utilization of the storage group's compression thread,
   measuring the storage group's performance based on its range of I/O operations per second (IOPS), and
   increasing or decreasing the compression ratio based on a target DRR of the storage array as a whole, the target DRR of the storage group, and a service level agreement (SLA).

10. The apparatus of claim 9 further configured to measure the state of the storage group periodically, wherein the storage group is one of a plurality of storage groups and a state of each storage group is measured periodically.

11. The apparatus of claim 9 wherein measuring the state of the storage group includes measuring the state of the storage group per I/O operations of an application.

12. The apparatus of claim 9 wherein measuring the state includes:
    monitoring a number of compressed I/O operations vs uncompressed I/O operations for the storage group; and
    comparing the number with the target DRR to ensure a compression bandwidth is fully utilized.

13. The apparatus of claim 9 further configured to determine if the I/O operations on the storage group is within or below the expected performance envelope.

14. The apparatus of claim 13 further configured to determine if the target data DRR of the storage array is met if the I/O operations on the storage group is below the expected performance envelope.

15. The apparatus of claim 9 further configured to adjust a service level of the I/O operations of an application based on whether the I/O operations are within the expected performance envelope.

16. The apparatus of claim 15 wherein adjusting the service level of the I/O operations of the application is further based on whether the target DRR of the storage array is met.

* * * * *